United States Patent [19]
Yamaguchi et al.

[11] Patent Number: 5,585,748
[45] Date of Patent: Dec. 17, 1996

[54] VOLTAGE-FREQUENCY CONVERTER CIRCUIT WITH TEMPERATURE COMPENSATION

[75] Inventors: Hironao Yamaguchi, Nukata-gun; Takao Ban, Toyohashi, both of Japan

[73] Assignee: Nippondenso Co., Ltd., Kariya, Japan

[21] Appl. No.: 497,152

[22] Filed: Jun. 30, 1995

[30] Foreign Application Priority Data

Jul. 1, 1994 [JP] Japan ............................ 6-173208

[51] Int. Cl.$^6$ ............................................. H03C 3/06
[52] U.S. Cl. ........................... 327/101; 327/73; 327/78; 327/561; 327/513
[58] Field of Search .................. 327/63, 65, 72, 327/101, 378, 379, 512, 513, 73, 78, 561, 563

[56] References Cited

U.S. PATENT DOCUMENTS

| | | | |
|---|---|---|---|
| 4,197,442 | 4/1980 | Carlsson et al. | 327/512 |
| 4,256,983 | 3/1981 | Griffith et al. | 327/101 |
| 4,390,799 | 6/1983 | Schmoock | 327/378 |
| 4,672,236 | 6/1987 | Toda et al. | 327/101 |
| 4,720,997 | 1/1988 | Doak et al. | 327/512 |
| 4,870,262 | 9/1989 | Hasegawa | 327/73 |
| 4,924,447 | 5/1990 | Fuji et al. | 327/73 |
| 5,166,550 | 11/1992 | Matsubara et al. | 327/73 |
| 5,204,631 | 4/1993 | Hobbs | 327/73 |
| 5,350,950 | 9/1994 | Inaba et al. | 327/72 |
| 5,495,193 | 2/1996 | Nukui | 327/101 |

FOREIGN PATENT DOCUMENTS

| | | |
|---|---|---|
| 6435218 | 2/1989 | Japan . |
| 277618 | 3/1990 | Japan . |
| 416715 | 1/1992 | Japan . |
| 5157602 | 6/1993 | Japan . |

Primary Examiner—Timothy P. Callahan
Assistant Examiner—My-Trang Nu Ton
Attorney, Agent, or Firm—Cushman, Darby & Cushman

[57] ABSTRACT

In a voltage-frequency converter having an integration circuit for integrating an input voltage signal in positive and negative directions, a first comparator is connected to switch integration direction of the integration circuit and a second comparator is connected to compare an integration output signal and a threshold signal. A delay circuit delays one of rising and falling edges of a second comparator output signal to be used as the threshold signal. The second comparator compares the delayed signal with a reference signal varying in accordance with a temperature and produces a second comparator output signal by which the integrating direction is switched. By the use of the delayed signal and the temperature dependent reference signal, a frequency change in the second comparator output signal caused by response time delays of the comparators is compensated for.

7 Claims, 5 Drawing Sheets

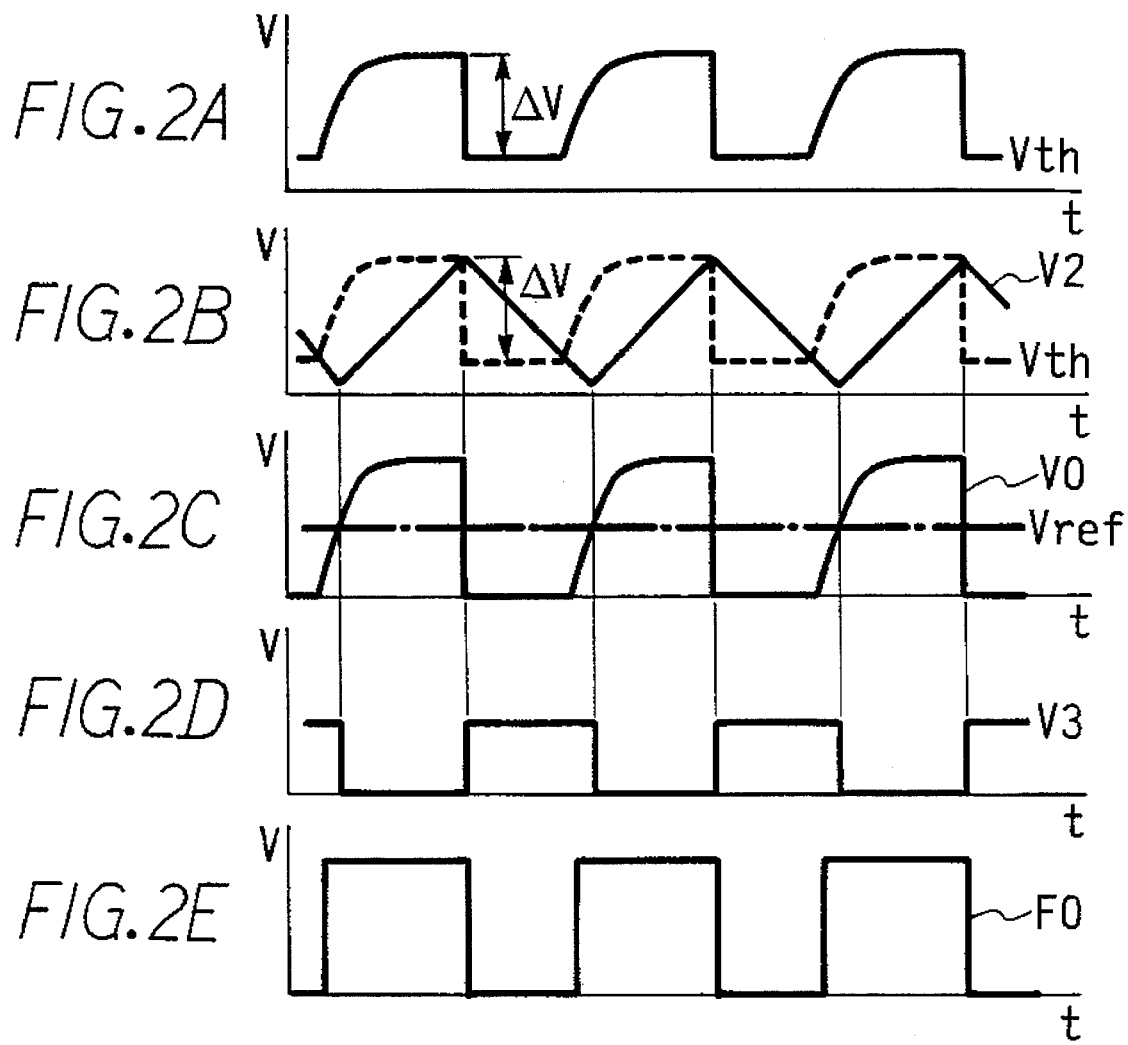

VOLTAGE-FREQUENCY CONVERTER CIRCUIT WITH TEMPERATURE COMPENSATION

CROSS REFERENCE TO RELATED APPLICATION

This application is based on and claims priority of Japanese Patent Application No. 6-173208 filed on Jul. 1, 1994, the content of which is incorporated herein by reference.

BACKGROUND OF THE INVENTION

1. Field of the Invention

The present invention relates to a voltage-frequency converter circuit which has a temperature compensation function and, more particularly, to a voltage-frequency converter circuit using a comparator and for use in heat-wire type air flow quantity measuring apparatuses.

2. Description of Related Art

A heat-wire type air flow measuring apparatus has been used to measure a quantity of intake air of an internal combustion engine. In this apparatuse, an electric heating current which is supplied to a heat-wire to keep the heat-wire at a predetermined temperature varies in dependence on a mass flow quantity of intake air. The heating current is converted into an electric voltage, which in turn is used as an electric output signal indicative of the air flow quantity.

The recent trend to use digital computers for engine control requires the air flow measuring apparatus to produce the electric output signal in digital form, which has less noise signals and may be processed easily by the digital computer. JP-A-2-77618 discloses one type of air flow measuring apparatuses, which includes a voltage-frequency converter circuit for converting an output voltage signal from a heat-wire control circuit into a corresponding frequency for use in the digital control.

In an engine compartment where the heat-wire air flow measuring apparatus is mounted, temperature varies largely depending on running conditions of the engine, causing changes in heat-wire operation characteristics and lowering accuracy in air flow measurement. To cope with this drawback, JP-A 2-77618 also proposes to reduce variations in the output frequency caused by the temperature change, by providing a necessary temperature compensation characteristics on an offset of an amplifier circuit connected to the heat-wire control circuit output and on a gain of the voltage-frequency converter circuit connected to the amplifier circuit.

The inventors, however, concluded from their own study that the output frequency variation caused by the temperature changes depends not on the characteristics change of the heat-wire but rather on a temperature-dependent response time delay of an output signal of a comparator used in the voltage-frequency converter circuit. The response delay is about several micro seconds (μsec.) in the event the temperature changes from normal (20° C.) to high (80° C.). This will result in flow quantity measurement error of about several tens of percent (%). It is therefore necessary to reduce the response time delay of the frequency-voltage converter circuit to less than 1 μsec. so that the air flow measurement error is reduced to a tolerable value, several percent (%), for use in the engine control.

SUMMARY OF THE INVENTION

The present invention has a primary objective to provide a voltage-frequency converter circuit which has less frequency output variation.

The present invention has a secondary objective to compensate for a temperature-dependent response time delay of a comparator in a simplified circuit configuration.

According to the present invention, a heat-wire control circuit, which controls a heat-wire for measuring an intake air flow and produces an output voltage signal corresponding to the mass air flow quantity, is connected to an integrator circuit. An integration output signal is compared with a threshold voltage signal and its comparison output signal is delayed. The delayed comparison output signal is further compared with a reference voltage signal to change the integration direction of the integrator circuit. The reference voltage signal is changed depending on a temperature in an engine compartment of an automotive vehicle. By this arrangement, the comparison output signal has a frequency proportional to the output signal of the heat-wire control circuit and the frequency variation is compensated.

BRIEF DESCRIPTION OF THE DRAWINGS

In the accompanying drawings:

FIGS. 2A through 2E are signal waveform charts illustrating signals developed in the first embodiment;

DETAILED DESCRIPTION OF THE PREFERRED EMBODIMENTS

The present invention is described in detail with reference to various presently preferred embodiments illustrated in the accompanying drawings.

Figure 1:
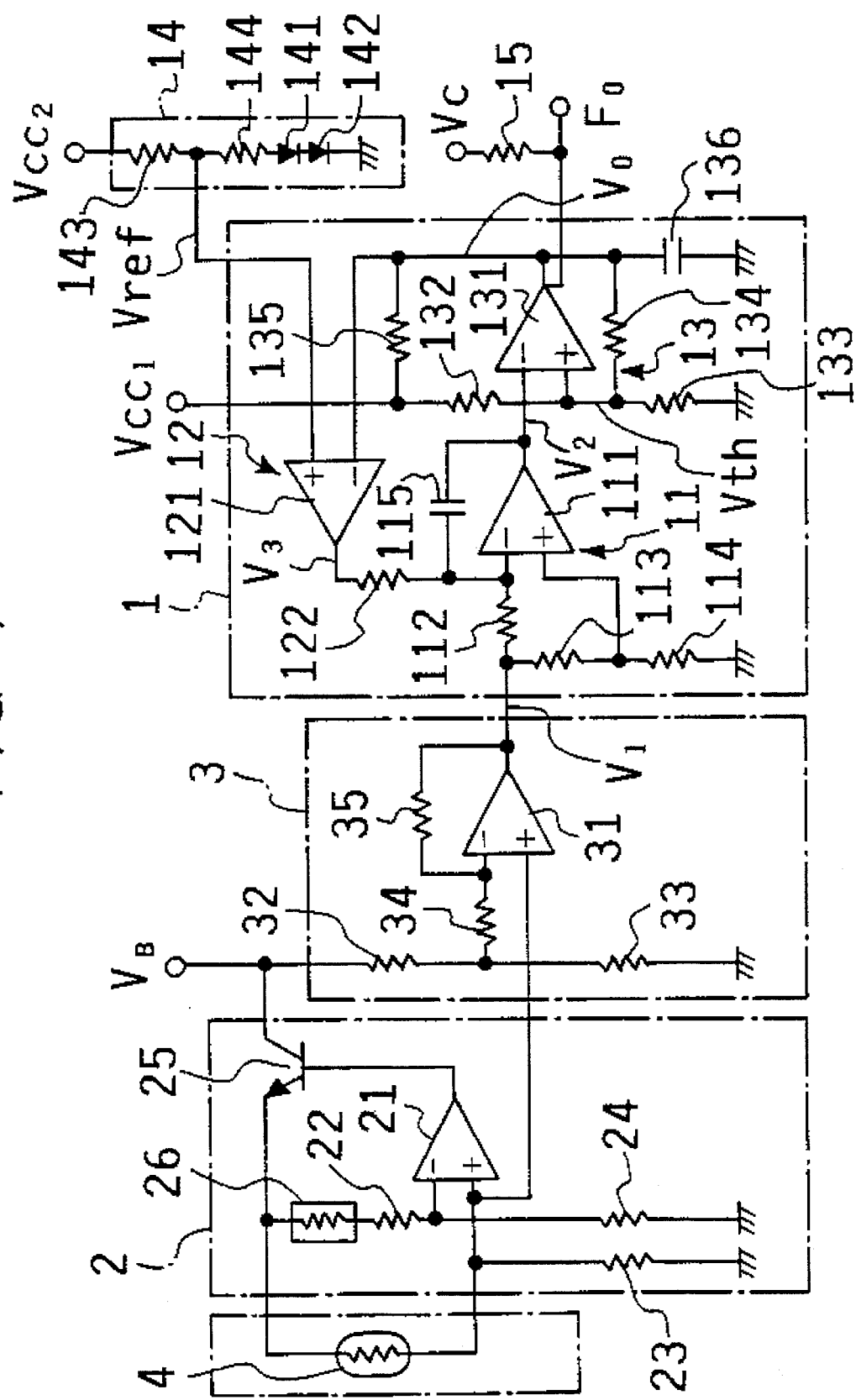
FIG. 1 is an electric wiring diagram illustrating a heat-wire type air flow measuring apparatus using a voltage-frequency converter circuit according to a first embodiment of the present invention.

As shown in FIG. 1, a first embodiment of this invention, a sensing heat-wire 4 is provided in an intake pipe of an internal combustion engine and connected to a heat-wire control circuit 2. The heat-wire control circuit 2, as known well in the art, includes an operational amplifier 21, resistors 22 through 24 connected to an input side of the amplifier 21 and forming a bridge circuit together with the heat-wire 4, and a transistor 25 driven by an output signal of the amplifier 21 to supply an electric current to the bridge circuit. A temperature compensating wire 26 is connected to the resistor 22 in series to detect a temperature of intake air flowing therethrough in the intake pipe. According to this heat-wire control circuit 2, the electric current supplied to the heat wire 4 is varied in dependence on a mass flow quantity of intake air supplied to the engine.

The resistor 23 converts the heat-wire current into a corresponding voltage signal, which in turn is applied to an amplifier circuit 3. The amplifier circuit 3 includes, as known well in the art, an operational amplifier 31 and resistors 32 through 35 so that the heat-wire voltage signal applied to the amplifier 31 is provided with a predetermined offset voltage and amplified thereby. The amplified voltage signal of the amplifier circuit 3 is applied to a voltage-frequency converter circuit 1 as a voltage signal V1.

The voltage-frequency converter circuit 1 includes an integrator circuit 11 including an operational amplifier 111 and a capacitor 115 connecting an inverting input terminal and an output terminal of the amplifier 111. The converter circuit 1 further includes a first comparator circuit 12 and a second comparator circuit 13. The first comparator circuit 12 includes a comparator 121 of the open-collector type, which switches over charging and discharging of the capacitor 115 in response to a voltage signal V3 to change integration output signal V2 in the positive and negative directions. The second comparator circuit 13 includes a comparator 131 of the open-collector type, which compares the integration output signal V2 with a threshold voltage signal Vth having predetermined hysteresis characteristics.

The voltage signal V1 is applied to an inverting terminal of the operational amplifier 111 through a resistor 112 and applied to a non-inverting terminal of the same after being divided by resistors 113 and 114. With the resistors 113 and 114 having the same resistance value, the current I flowing through the resistor 112 is expressed by the following equation:

$$I=V1\{1-R114/(R113+R114)\}/R112=V1/(2\ R112)$$

The comparison output signal V3 of the comparator 121, which is either a ground potential or a high impedance, is applied to the inverting input terminal of the amplifier 111 through a resistor 122. With the resistor 122 having the resistance value R122=R112/2, when the signal V3 is at the ground potential, an electric current with the same magnitude as current I flows from the output terminal of the amplifier 111 to the inverting input terminal of the same through the capacitor 115. As a result, the output voltage signal V2 increases at a constant increasing rate as shown by solid line in FIG. 2B. When the comparison output signal V3 is at the high impedance, on the other hand, the current I flows reversely from the inverting input terminal to the output terminal through the capacitor 115 and the integration output signal V2 decreases at a constant decreasing rate as shown by the solid line in FIG. 2B.

The comparator 131 receives the integration output signal V2 at an inverting input terminal thereof. A non-inverting terminal of the comparator 131 is connected to a resistor 132 and a resistor 133, which are connected to a constant voltage source Vcc1 and the ground, respsctively. A resistor 135 is connected between the output terminal of the comparator 131 and the voltage source Vcc1, and a resistor 134 is connected between the output terminal and the non-inverting terminal of the comparator 131. The resistors 132 through 135 forms a resistor network to provide the hysteresis on the threshold voltage signal Vth applied to the non-inverting terminal of the comparator 131. The threshold signal Vth becomes high and low when the output voltage signal Vo is at high impedance and at the ground potential, respectively, as shown in FIG. 2A (dotted line in FIG. 2B). The difference in the threshold signal Vth is the hysteresis ΔV.

A capacitor 136 for signal delaying is connected between the output terminal of the comparator 131 and the ground so that the comparison output signal Vo, and also the threshold signal Vth, is delayed to rise slowly from the low level to the high level as shown in FIG. 2C.

The comparator 121 receives the output signal Vo and a reference voltage signal Vref at an inverting input terminal and a positive input terminal of the comparator 121, respectively, and compares the two to produce a comparison output signal V3 therefrom as shown in FIG. 2D.

The reference signal Vref is produced from a reference voltage circuit 14, which includes resistors 143, 144 and diodes 141, 142 connected between a constant voltage supply Vcc2 and the ground to produce the reference voltage signal Vref at a junction between the resistors 143 and 144. Since the forward voltage of the diodes 141 and 142 decreases as the temperature in the automotive vehicle engine compartment, the reference signal Vref decreases as the temperature rises.

A frequency signal Fo is produced at another output terminal of the comparator 131, to which a pull-up resistor 15 is connected, and is in the same phase as the comparison output signal Vo as shown in FIG. 2E. The period of the frequency signal Fo corresponds to a time period in which the integration output signal V2 changes by the hysteresis amount ΔV as shown in FIG. 2B. The frequency F of the frequency signal Fo is an inverse of the period and proportional to the voltage-signal V1 indicative of the mass air flow quantity as understood from the following expression:

$$F=V1/(4\times C115\times R112\times \Delta V)$$

It is to be noted that response delay times of the comparators 121 and 131 increase as the temperature rises and assume that the response delay time increases of the comparators 121 and 131 are t1 and t2, respectively. Each time the comparators 121 and 131 reverses the respective comparison output signals V0 and V3, the response delays are caused. This response delay time is 4(t1+t2) in one cycle period. Thus, under the high temperature condition, one cycle period of the frequency signal F0 becomes longer by this delay time than that produced under the normal temperature condition.

In the present embodiment, as described below, the reference voltage Vref is decreased as the temperature rises so that switching of the integration directions occurs earlier to compensate for the response delay times of the comparators 121 and 131. The amount of the decrease in the reference voltage Vref should be determined to be the time 2(t1+t2).

Figure 3A:
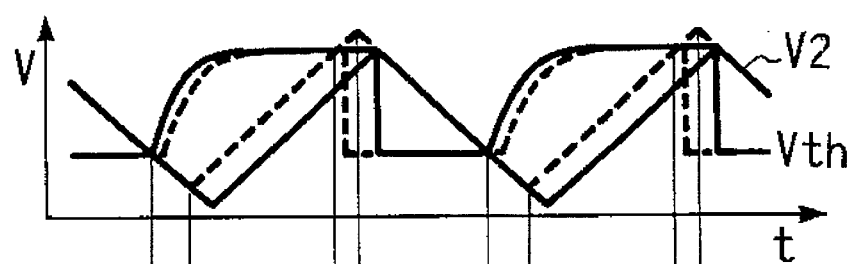
FIGS. 3A through 3C are signal waveform charts illustrating signals developed in the first embodiment.
Figure 3B:
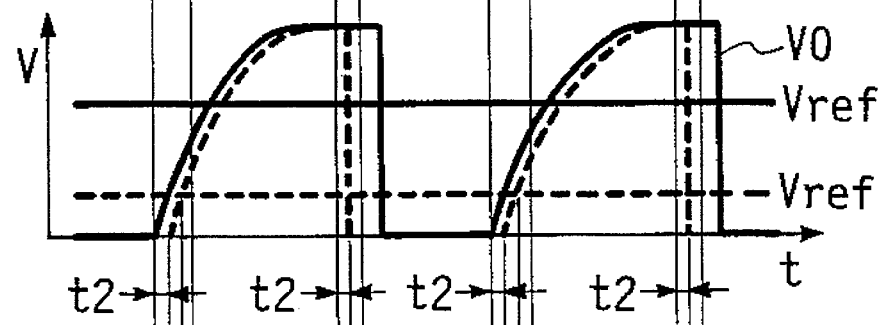
Figure 3C:
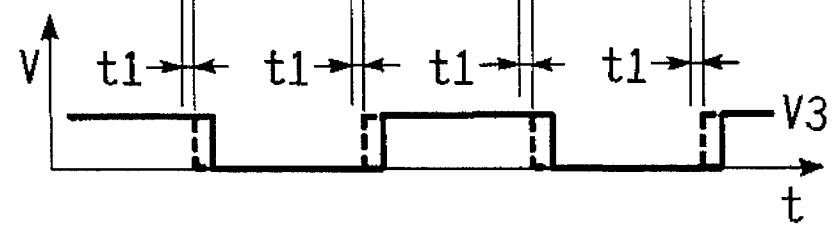

When the temperature in the engine compartment rises, the resistances of the diodes 141 and 142 decreases and, as a result, the reference voltage Vref decreases as indicated by the solid line and the dotted line in FIG. 3B. Under the high temperature condition, the comparator 121 has the response delay time t1 and, hence, the output signal V3 produced by the comparison of the signals Vo and Vref is delayed by the time t1 relative to the time the comparison output signal Vo reaches the reference signal Vref as shown in FIG. 3C.

Further, since the comparator 131 also has the response delay time t2, the comparison output signal Vo produced by the comparison of the voltage signals V2 and Vth (dotted line in FIG. 3A) is delayed by the time t2 than the time the integration output voltage signal V2 reaches the threshold signal Vth.

As shown in FIG. 3B, however, the comparison output signals Vo (i.e., the frequency signal Fo) under the normal temperature condition (solid line) and under the high temperature condition (dotted line) are the same in frequency. Thus, the frequency of the frequency signal Fo does not change even when the ambient temperature the in the engine compartment changes.

Figure 4:
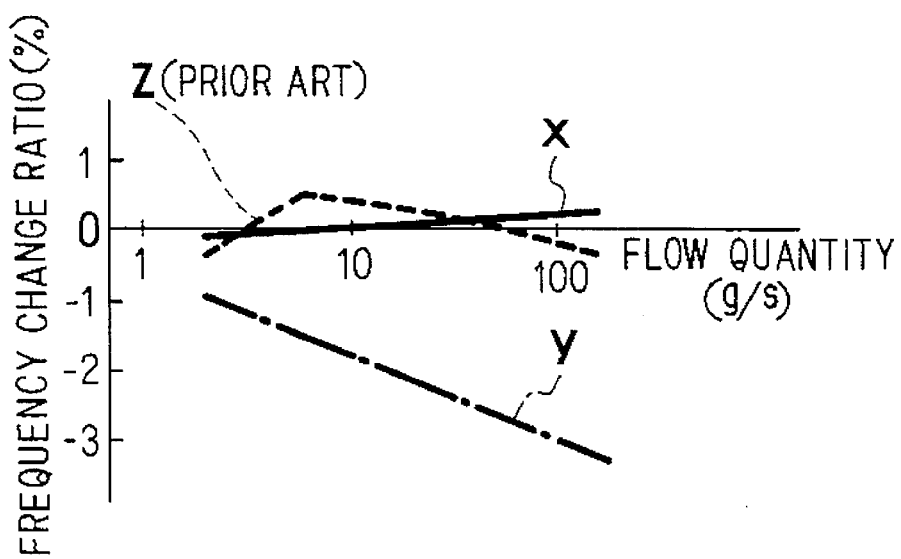
FIG. 4 is a graph illustrating a frequency change ratio of the voltage-frequency converter circuit according to the first embodiment.

The advantage of the air flow measuring apparatus using the above-described first embodiment is shown in FIG. 4. In this Figure, a characteristic curve X shows a frequency change ratio relative to an air flow quantity Q when the temperature rises from 20° C. to 80° C. It will be understood that the change ratio (curve X) is reduced remarkably by the above-described temperature compensation than in the case (characteristic curve Y) where no temperature compensation is provided and that the change rate (curve X) is reduced more than in the case of the prior art according to JP-A 2-77618 (curve Z).

As a modification of the above-described first embodiment, the comparison output signal Vo may be used directly as the frequency signal Fo in the case the frequency signal Fo need not be in a rectangular pulse form. As further alternative embodiments of the voltage-frequency converter circuit according to the invention, the comparator circuit 13 and the reference signal changing circuit 14 may be constructed as follows.

Figure 5:
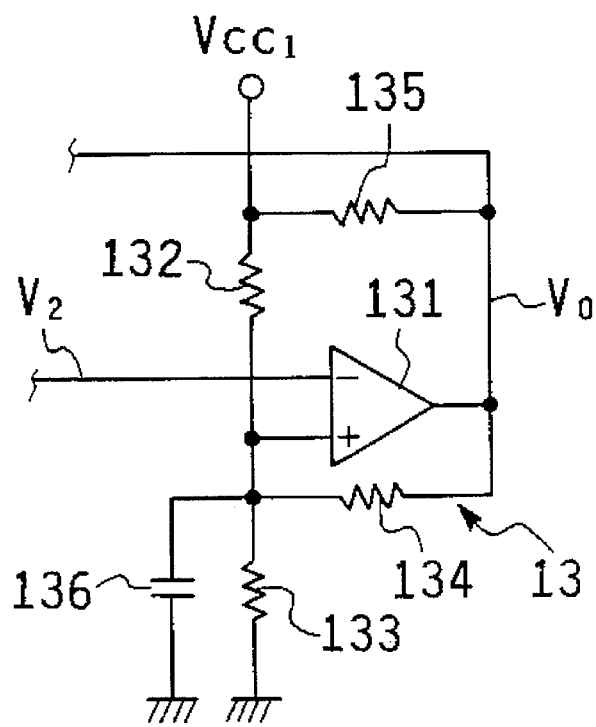
FIG. 5 is an electric wiring diagram illustrating a part of a voltage-frequency converter circuit according to a second embodiment of the present invention.

As shown in FIG. 5 as a second embodiment, the capacitor 136 may be connected between the ground and the non-inverting input terminal of the comparator 131 to which the resistors 132 and 133 are connected.

Figure 6:
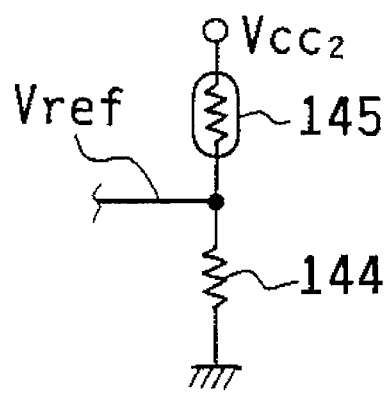
FIG. 6 is an electric wiring diagram illustrating a reference voltage circuit according to a third embodiment of the present invention.

As shown in FIG. 6 as a third embodiment, the reference voltage signal circuit 14 may be so configured that the resistor 144 is connected in series with a thermistor 145 which increases the resistance thereof in accordance with the temperature rise.

Figure 7:
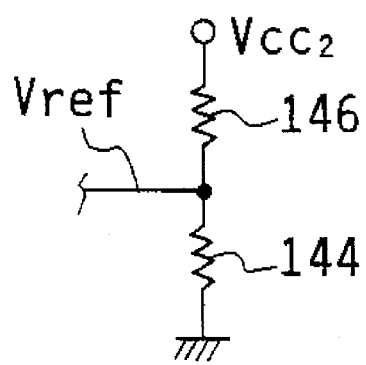
FIG. 7 is an electric wiring diagram illustrating a reference voltage circuit according to a fourth embodiment of the present invention.

As shown in FIG. 7 as a fourth embodiment, the resistors 144 and 146 having different temperature-resistance characteristics may be connected in series.

Figure 8:
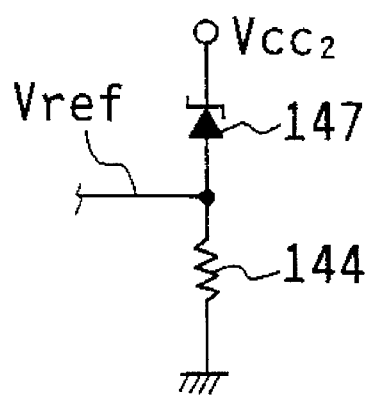
FIG. 8 is an electric wiring diagram illustrating a reference voltage circuit according to a fifth embodiment of the present invention.

As shown in FIG. 8 as a fifth embodiment, the reisitor 144 and a Zener diode 147 may be connected in series.

Figure 9:
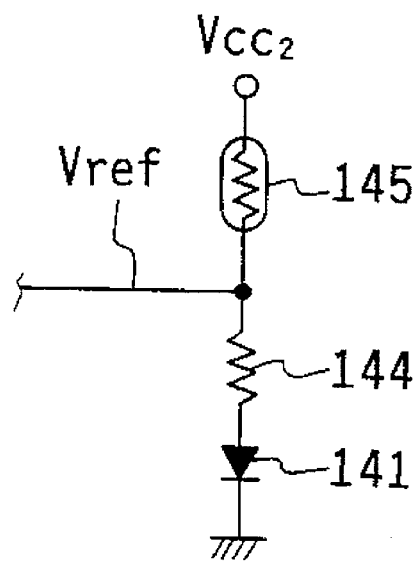
FIG. 9 is an electric wiring diagram illustrating a reference voltage circuit according to a sixth embodiment of the present invention.

As shown in FIG. 9 as a sixth embodiment, the resistor 144, the thermistor 145 and the diode 141 may be connected in series.

Figure 10:
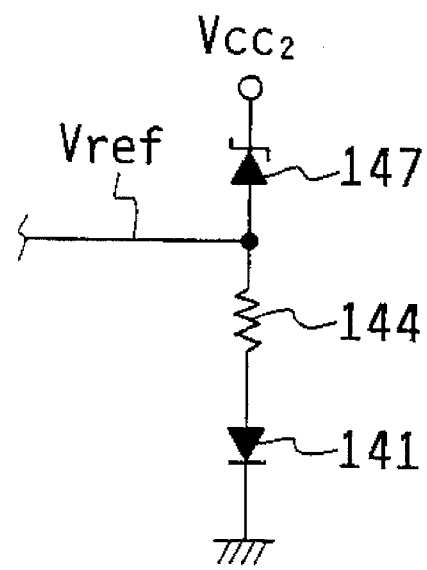
FIG. 10 is an electric wiring diagram illustrating a reference voltage circuit according to a seventh embodiment of the present invention.

As shown in FIG. 10 as a seventh embodiment, the Zener diode 147, the resistor 144 and the diode 141 may be connected in series.

Figure 11:
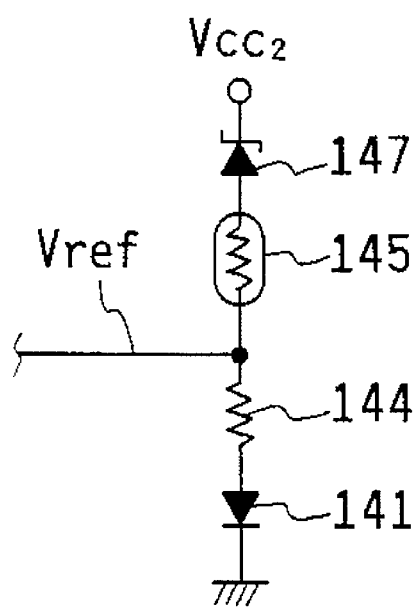
FIG. 11 is an electric wiring diagram illustrating a reference voltage circuit according to an eighth embodiment of the present invention.

As shown in FIG. 11 as an eighth embodiment, the Zener diode 147, the thermistor 145, the resistor 144 and the diode 141 may be connected in series.

Figure 12:
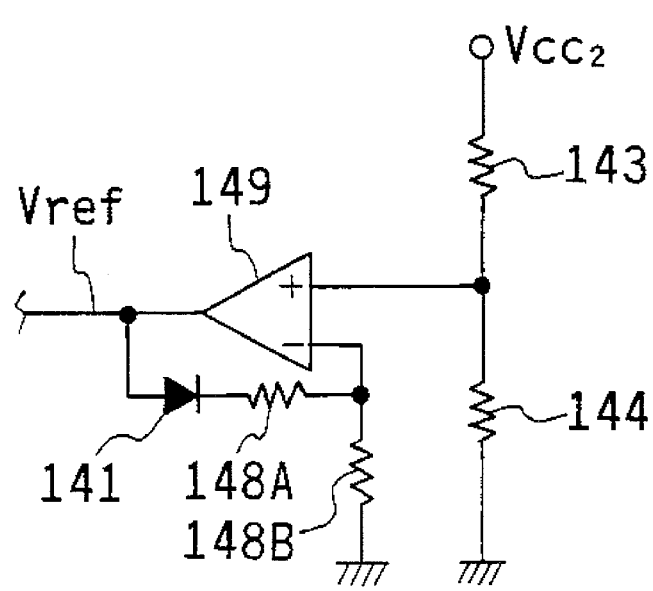
FIG. 12 is an electric wiring diagram illustrating a reference voltage circuit according to a ninth embodiment of the present invention.

As shown in FIG. 12 as a ninth embodiment, the junction between the resistors 143 and 144 for the voltage division may be connected to a buffer 149 comprising an operational amplifier and its negative feedback path may be formed with the diode 141 and resistors 148A and 148B.

The present invention having been described hereinabove is not be limited to the foregoing embodiments but should be interpreted in view of the spirit and the scope of the invention.

What is claimed is:

1. A voltage-frequency converter circuit, comprising:

an integrator circuit including an operational amplifier and a capacitor connecting an inverting input terminal and an output terminal of the operational amplifier, said integrator circuit receiving an input voltage signal for integration therein;

a first comparator circuit including a first comparator, the first comparator comprising two input signals thereto and switching over charging and discharging of the capacitor by a first comparison output signal thereof to reverse a changing direction of an integration output signal of the integrator circuit;

a second comparator circuit including a second comparator, the second comparator comparing the integration output signal with a threshold signal having hysteresis characteristics, a second comparison output signal of said second comparator having a frequency varying in accordance with the input voltage signal received by the integrator circuit;

a delay circuit for delaying the second comparison output signal at a rising edge thereof and applying a delayed signal to the first comparator as one of the two input signals; and a reference signal circuit for providing a reference signal which is varied in accordance with a temperature and applying the reference signal to the first comparator as the other of the two input signals.

2. A voltage-frequency converter circuit according to claim 1, further comprising:

a heat-wire disposed in an intake pipe of an internal combustion engine; and a control circuit connected between the heat-wire and the integrator circuit for controlling an electric current supplied to the heat-wire and providing the input voltage signal corresponding to the electric current.

3. A voltage-frequency converter circuit according to claim 1, wherein:

said first comparator and said second comparator are of open-collector type; and said delay circuit includes a capacitor.

4. A voltage-frequency converter circuit according to claim 1, wherein:

said reference signal circuit includes at least one of a diode and a resistor responsive to an ambient temperature.

5. A voltage-frequency converter, comprising:

integration means for integrating a voltage signal applied thereto in positive and negative directions;

first comparison means including a first comparator for comparing an output voltage signal of said integration means with a threshold voltage signal;

delay means for delaying one of rising and falling edges of an output voltage signal of said first comparison means;

reference voltage signal generation means for generating a reference voltage signal varying in accordance with a temperature; and second comparison means including a second comparator for comparing an output voltage signal of said delay means with said reference voltage signal, said second comparison means changing an integrating direction of said integrating means by an output voltage signal thereof.

6. A voltage-frequency converter according to claim 5, wherein:

said delay means includes a capacitor which defines a changing rate of said one of rising and falling edges with respect to time.

7. A voltage-frequency converter according to claim 5, wherein:

said delay means and said reference signal generation means are so constructed as to cause a frequency change ratio of said integration means relative to said voltage signal applied thereto changes substantially linearly relative to said applied voltage signal.

* * * * *